(12) United States Patent
Mesgarani et al.

(10) Patent No.: US 11,988,565 B2
(45) Date of Patent: May 21, 2024

(54) PROCESS-INSENSITIVE SENSOR CIRCUIT

(71) Applicant: Apple Inc., Cupertino, CA (US)

(72) Inventors: Ali Mesgarani, Sunnyvale, CA (US); Farzan Farbiz, Mountain View, CA (US); Ke Yun, San Jose, CA (US); Dusan Stepanovic, Mountain View, CA (US); Seyedeh Sedigheh Hashemi, Santa Clara, CA (US); Mansour Keramat, Los Gato, CA (US)

(73) Assignee: Apple Inc., Cupertino, CA (US)

( * ) Notice: Subject to any disclaimer, the term of this patent is extended or adjusted under 35 U.S.C. 154(b) by 178 days.

(21) Appl. No.: 17/313,844

(22) Filed: May 6, 2021

(65) Prior Publication Data
US 2022/0357212 A1    Nov. 10, 2022

(51) Int. Cl.
*G01K 7/14* (2006.01)
*G01K 7/16* (2006.01)
*H01L 21/66* (2006.01)
*G06F 1/20* (2006.01)

(52) U.S. Cl.
CPC ............... *G01K 7/16* (2013.01); *H01L 22/12* (2013.01); *G01K 7/14* (2013.01); *G06F 1/206* (2013.01)

(58) Field of Classification Search
CPC  G01K 7/16; G01K 7/01; G01K 7/425; G01K 7/14; G06F 1/206; H01L 22/12
USPC .......................................................... 702/99
See application file for complete search history.

(56) References Cited

U.S. PATENT DOCUMENTS

| | | | | |
|---|---|---|---|---|
| 4,044,238 A | * | 8/1977 | Emschermann | G01K 3/00 374/170 |
| 5,253,190 A | * | 10/1993 | Srinivasan | G01K 13/02 374/E13.006 |
| 5,473,629 A | * | 12/1995 | Muramoto | G01K 13/20 374/102 |
| 5,619,122 A | * | 4/1997 | Kearney | H03F 1/302 323/907 |
| 5,838,578 A | * | 11/1998 | Pippin | G06F 11/3093 374/173 |
| 5,857,777 A | * | 1/1999 | Schuh | G01K 15/00 374/170 |

(Continued)

FOREIGN PATENT DOCUMENTS

| | | | | |
|---|---|---|---|---|
| CN | 105074477 A | * | 11/2015 | ............... A45C 1/02 |
| CN | 207636750 U | * | 7/2018 | |

(Continued)

OTHER PUBLICATIONS

17313844_2023-12-20_CN_105074477_B_H.pdf,Nov. 18, 2015.*

*Primary Examiner* — Gail Kaplan Verbitsky
(74) *Attorney, Agent, or Firm* — Kowert, Hood, Munyon, Rankin & Goetzel, P.C.; Mark D. Seegers; Dean M. Munyon

(57) ABSTRACT

A sensor system included in an integrated circuit includes multiple sensor circuits and a control circuit. Using characterization data, a model may be generated that defines a relationship between measurable parameters of the integrated circuit and an operating characteristic of the integrated circuit. The control circuit can combine, using a function included in the model, data from the multiple sensor circuits to determine a value of the operating characteristic that is more accurate than a sensor circuit configured to measure a single parameter of the integrated circuit that varies with the operating characteristic.

19 Claims, 13 Drawing Sheets

(56) References Cited

U.S. PATENT DOCUMENTS

| | | | | |
|---|---|---|---|---|
| 6,786,639 B2* | 9/2004 | Covi | ............... | G01K 7/00 |
| | | | | 374/185 |
| 7,139,682 B2* | 11/2006 | Janke | ............... | G01D 3/022 |
| | | | | 702/189 |
| 7,410,293 B1* | 8/2008 | Santurkar | ............... | G01K 15/00 |
| | | | | 374/170 |
| 7,609,577 B2 | 10/2009 | Anand et al. | | |
| 7,628,535 B2* | 12/2009 | Vaz | ............... | G07C 3/04 |
| | | | | 374/102 |
| 8,161,431 B2* | 4/2012 | Buonpane | ............... | G06F 30/36 |
| | | | | 716/136 |
| 8,912,877 B2* | 12/2014 | Ling | ............... | G06F 1/3203 |
| | | | | 713/320 |
| 9,748,969 B1* | 8/2017 | Bach | ............... | H03M 3/496 |
| 10,326,429 B1* | 6/2019 | Lin | ............... | H03K 3/011 |
| 10,771,080 B1* | 9/2020 | Bacigalupo | ............... | H03K 17/567 |
| 2002/0140447 A1* | 10/2002 | Throngnumchai | ............... | G01K 7/42 |
| | | | | 374/E7.042 |
| 2002/0144415 A1* | 10/2002 | Dang | ............... | G02B 27/143 |
| | | | | 33/286 |
| 2002/0180543 A1* | 12/2002 | Song | ............... | G11C 7/04 |
| | | | | 331/176 |
| 2004/0071183 A1* | 4/2004 | Tesi | ............... | G01K 7/01 |
| | | | | 374/1 |
| 2005/0248329 A1* | 11/2005 | Sato | ............... | G11B 7/126 |
| | | | | 323/312 |
| 2006/0221741 A1* | 10/2006 | Jain | ............... | G11C 11/40626 |
| | | | | 374/E7.043 |
| 2010/0097345 A1* | 4/2010 | Jang | ............... | G06F 3/041661 |
| | | | | 345/174 |
| 2014/0341257 A1* | 11/2014 | Bernardinis | ......... | G01D 5/2454 |
| | | | | 374/178 |
| 2015/0355037 A1* | 12/2015 | Cottin | ............... | H01L 23/34 |
| | | | | 374/1 |
| 2018/0054169 A1* | 2/2018 | Lam | ............... | H03F 1/302 |
| 2018/0073933 A1* | 3/2018 | Keskin | ............... | G06F 1/206 |
| 2019/0150802 A1* | 5/2019 | Budiman | ............... | G16H 40/40 |
| 2019/0220697 A1 | 7/2019 | Kiemele et al. | | |
| 2019/0258251 A1 | 8/2019 | Ditty et al. | | |
| 2020/0020412 A1* | 1/2020 | Biberidis | ............... | G11C 29/38 |
| 2020/0293080 A1 | 9/2020 | Poon et al. | | |
| 2022/0239462 A1* | 7/2022 | Casu | ............... | H04Q 9/00 |

FOREIGN PATENT DOCUMENTS

| | | | | |
|---|---|---|---|---|
| CN | 108579088 A | * | 9/2018 | ............ A63F 13/55 |
| DE | 102015216806 A1 | * | 3/2017 | ............ G01D 18/00 |
| JP | H7151818 A | * | 6/1996 | |
| WO | 2014182934 | | 11/2014 | |
| WO | 2020081524 | | 4/2020 | |

* cited by examiner

PROCESS-INSENSITIVE SENSOR CIRCUIT

BACKGROUND

Technical Field

This disclosure relates to sensor circuits in integrated circuits and, more particularly, to temperature sensor circuit operation.

Description of the Related Art

Modern computer systems may perform certain tasks or operations in response to changes in the environments in which the computer systems are located. For example, changes in ambient light may result in a computer system adjusted brightness of a display. Additionally, changes in temperature may result in a computer system adjusting a level processing being performed in order to maintain the computer system within designated thermal limits. In some cases, rapid changes in acceleration may result in the computer system taking certain actions to prevent damage to movable parts within the computer system.

To react to changes in environment, a computer system may include multiple sensor circuits designed to detect various effects or situations. For example, such sensor circuit may include temperature sensors, acceleration sensors, ambient light sensors, and the like. The outputs of such sensor circuits may be polled by a processor or controller included in the computer system to determine what actions to perform.

Sensor circuits, such as those described above, may include any suitable combination of logic circuits, analog circuits, mixed-signal circuits, and the like. In some cases, the sensor circuits may employ passive sensing techniques. Other sensor circuits may employ active sensing by injecting signals into a medium to be sensed, and monitoring any returning signals.

SUMMARY OF THE EMBODIMENTS

Various embodiments for a sensor system are disclosed. Broadly speaking, a plurality of sensor circuits included in an integrated circuit are configured to measure corresponding ones of a plurality of physical parameters of the integrated circuit. A control circuit is configured to receive respective information indicative of the plurality of physical parameters. In response to an activation of a calibration mode, the control circuit is configured to generate a linear regression model that correlates an operating characteristic of the integrated circuit to the plurality of physical parameters, and, in response to an activation of a mission mode, the control circuit is configured to determine a value of the operating characteristic using the linear regression model and the plurality of physical parameters.

DETAILED DESCRIPTION OF EMBODIMENTS

In many computer systems, sensor circuits are used to measure operating characteristics of such computer systems, which may be used to adjust the operation the computer systems. For example, in some computer systems, the temperature of a computer system is monitored in order to protect the computer system against overheating or other functional failures resulting from the temperature exceeding allowed limits. In some cases, high-precision temperature sensors may be needed to monitor changes in the temperature of a computer system.

Many computer systems rely on different types of temperature sensors. For example, in some computer systems, metal-oxide semiconductor threshold sensors, polysilicon resistor sensors, and bipolar device sensors, may be included in an integrated circuit to measure the temperature of the integrated circuit during operation. Such sensor circuits typically rely on a single physical parameter (e.g., metal-oxide semiconductor threshold voltage) whose value varies with temperature in order to determine a value for the temperature.

During manufacture of an integrated circuit, variations resulting from the manufacturing process (referred to as "process variation") can result in unwanted variation in the circuits included in the integrated circuit. For example, differences in lithography, dopant implant levels, etc., can result in transistors, resistors, and other devices, deviating from desired values. This is problematic for sensor circuits that rely on a single physical parameter of the integrated circuit. While the single physical parameter varies with temperature, process variation can also cause the value of the single physical parameter to vary. Additionally, other effects, such as mechanical stress, can also cause the single physical parameter to change value.

Sensor circuits that rely solely on a single physical parameter can generate inaccurate data resulting from the sources of variation described above. In some cases, analog techniques (e.g., dynamic element matching) may be employed to mitigate some of the sources of variation, but sensor circuits employing such analog techniques may still not achieve desired levels of accuracies. Techniques described in the present disclosure allow for a model-based approach using a correlation between multiple observable physical parameters and an operating characteristic (e.g., temperature) of a computer system, in order to determine a value for the operating characteristic. Determining a value of the operating characteristic in this fashion may improve the accuracy of the determined value of the operating characteristic by comprehending how the operating characteristic is varying with changes in the multiple observable physical parameters.

Figure 1:
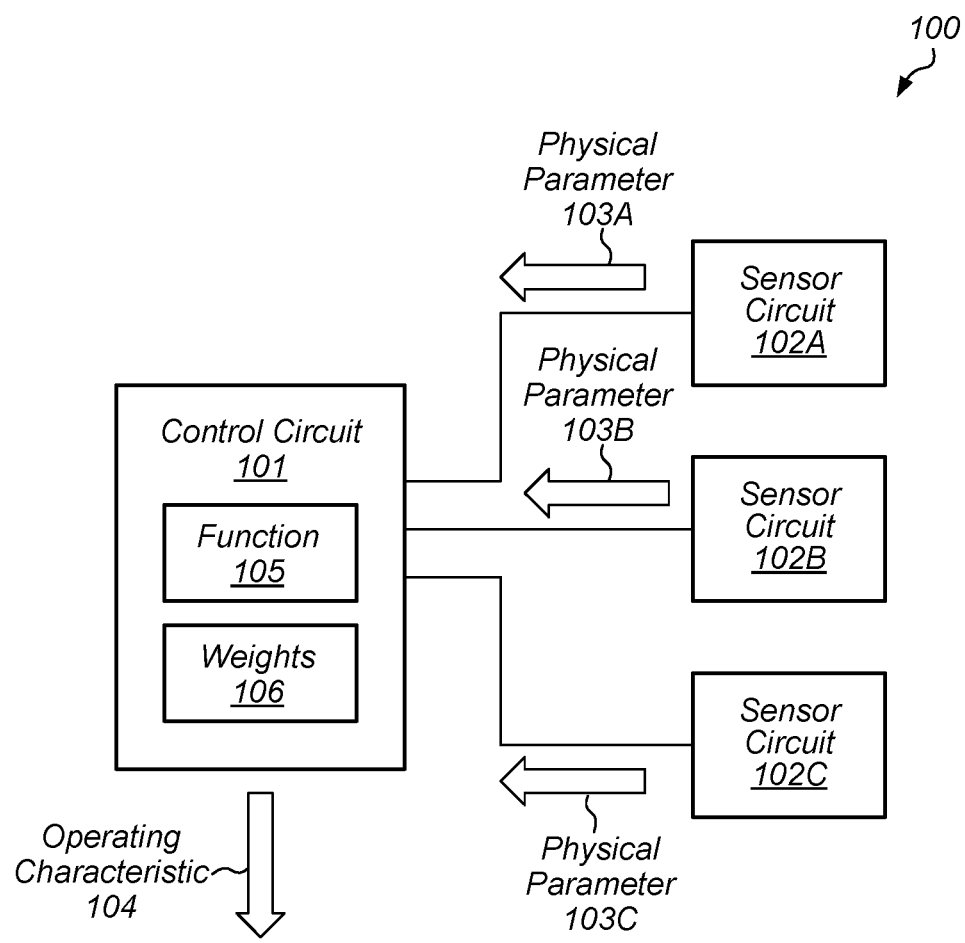
FIG. 1 is a block diagram of an embodiment of a sensor system for a computer system.

A block diagram depicting an embodiment of a sensor system for an integrated circuit is depicted in FIG. 1. As illustrated, sensor system 100 includes control circuit 101 and sensor circuits 102A-102B.

Sensor circuits 102A-102B are configured to measure corresponding ones of physical parameters 103A-103B. Physical parameters 103A-103B may include various observable physical characteristics of the integrated circuit. For example, in some embodiments, physical parameters 103A-103B may include resistance of a polysilicon layer used in the integrated circuit, a metal-oxide semiconductor field-effect transistor (MOSFET) threshold voltage, and a base-to-collector current gain of a bipolar device (referred to as "β"). In some cases, physical parameters 103A-103B may include a current (or voltage) that is proportional to absolute temperature (referred to as "PTAT"), and/or a current (or voltage) that is complementary to absolute temperature (referred to as "CTAT").

As described below, sensor circuits 102A-102B may include circuits with varying circuit topologies configured to generate signals indicative of one or more of physical parameters 103A-103B. In some embodiments, sensor circuits 102A-102B may be co-located with control circuit 101 on the integrated circuit. In other embodiments, sensor circuits 102A-102B and control circuit 101 may be located at various locations across the integrated circuit. In such cases, physical parameters 103A-103B may be relayed to control circuit 101 via a communication bus or other suitable structure. It is noted that although only three sensor circuits are depicted in the embodiment of FIG. 1, in other embodiments, any suitable number of sensor circuits may be employed.

Control circuit 101 is configured to receive physical parameters 103A-103B. In various embodiments, control circuit 101 may be configured to receive analog signals whose respective voltage levels correspond to values of physical parameters 103A-103B. Alternatively, control circuit 101 may be configured to receive respective sets of bits from sensor circuits 102A-102B whose values correspond to values of physical parameters 103A-103B.

Control circuit 101 is also configured, in response to an activation of a calibration mode, to generate weights 106, which are associated with function 105 that correlates to operating characteristic 104 to physical parameters 103A-103B. In various embodiments, operating characteristic 104 may include temperature or other suitable operating characteristics of the integrated circuit. As describe below, during the calibration mode, control circuit 101 may alternatively load function 105 from an external source.

In response to an activation of a mission mode, control circuit 101 is configured to evaluate function 105 using weights 106 and physical parameters 103A-103B to determine a value of operating characteristic 104. As used and described herein, mission mode refers to a mode of operation during which sensor system 100 periodically determines the value for operating characteristic 104. In some embodiments, sensor system 100 may determine a value for operation characteristic 104 at regular intervals. Alternatively, sensor system 100 may, in other embodiments, determine a value for operating characteristic 104 in response to receiving a request or other signal from other circuits included on the integrated circuit.

As used herein, a function, such as function 105, defines a relationship between observable, i.e. measurable, parameters of an integrated circuit and an operating characteristic of the integrated circuit. In various embodiments, function 105 and weights 106 may be collectively referred to as a model. Function 105 defines how to combine values of the observable parameters in order to generate a value for the operating characteristic. In some cases, one or more of the observable parameters may be scaled using weight values as part of the combination process. Some functions specify how values of the observable parameters may be multiplied by corresponding weight values to form intermediate products that may then be added together to generate the value for the operating characteristic. An example of how observable parameters may be combined to determine a temperature value is depicted in Equation 1, where $\alpha_0$, $\alpha_1$, $\alpha_{11}$, $\alpha_2$, $\alpha_{22}$ and $\alpha_{12}$ are weight values, $V_{PTAT}$ is a voltage proportional to absolute temperature, and β is the base-to-collector current gain of a bipolar device used in a sensor circuit. It is noted that Equation 1 is merely an example for determining a temperature value and that, in other embodiments, different observable parameters and weight values may be employed to determine temperature or other operating characteristics of an integrated circuit.

$$\text{Temperature} = \alpha_0 + \alpha_1 V_{PTAT} + \alpha_{11} V_{PTAT}^2 + \ldots + \alpha_2 \beta + \alpha_{22} \beta^2 + \ldots + \alpha_{12} V_{PTAT} \beta + \quad (1)$$

The function and weights in a model may be determined using numerous methods. As described below, machine learning may be applied using characterization data to determine correlation between the observable physical parameters and the operating characteristic. The process of determining the correlation between the observable physical parameters and the operating characteristic can be referred to as "training the model." In some embodiments, the machine learning used to train the model may include performing multiple linear regression. The training may take place external to an integrated circuit during a post-manufacture test and characterization operation. Alternatively, the training may take place on the integrated circuit using data gathered from sensor circuits. In some cases, the model may be periodically re-trained during the lifetime of the integrated circuit to compensate for device aging and other effects associated with long-term operation of an integrated circuit.

In some cases, a function included in a model may be "hard wired" into a sensor system, by designing a logic circuit to combine the weights and the observable physical parameters in a particular fashion. Alternatively, the function may be coded as program instructions that may be executed by a general-purpose processor circuit. In such cases, the model may be changed or modified based to account for changes in an integrated circuit. For example, as the integrated circuit changes, the model may be modified to account for MOSFET aging and the like. Such changes in a model may be part of operating system or other software upgrades.

As described above, different types of sensor circuits that use different physical characteristics of an integrated circuit may be employed to determine a single operating characteristic of the integrated circuit. Some sensor circuits may be configured to determine a value for a single observable physical parameter, while other sensor circuits may be configured to generate respective values for multiple observable physical parameters.

Figure 2:
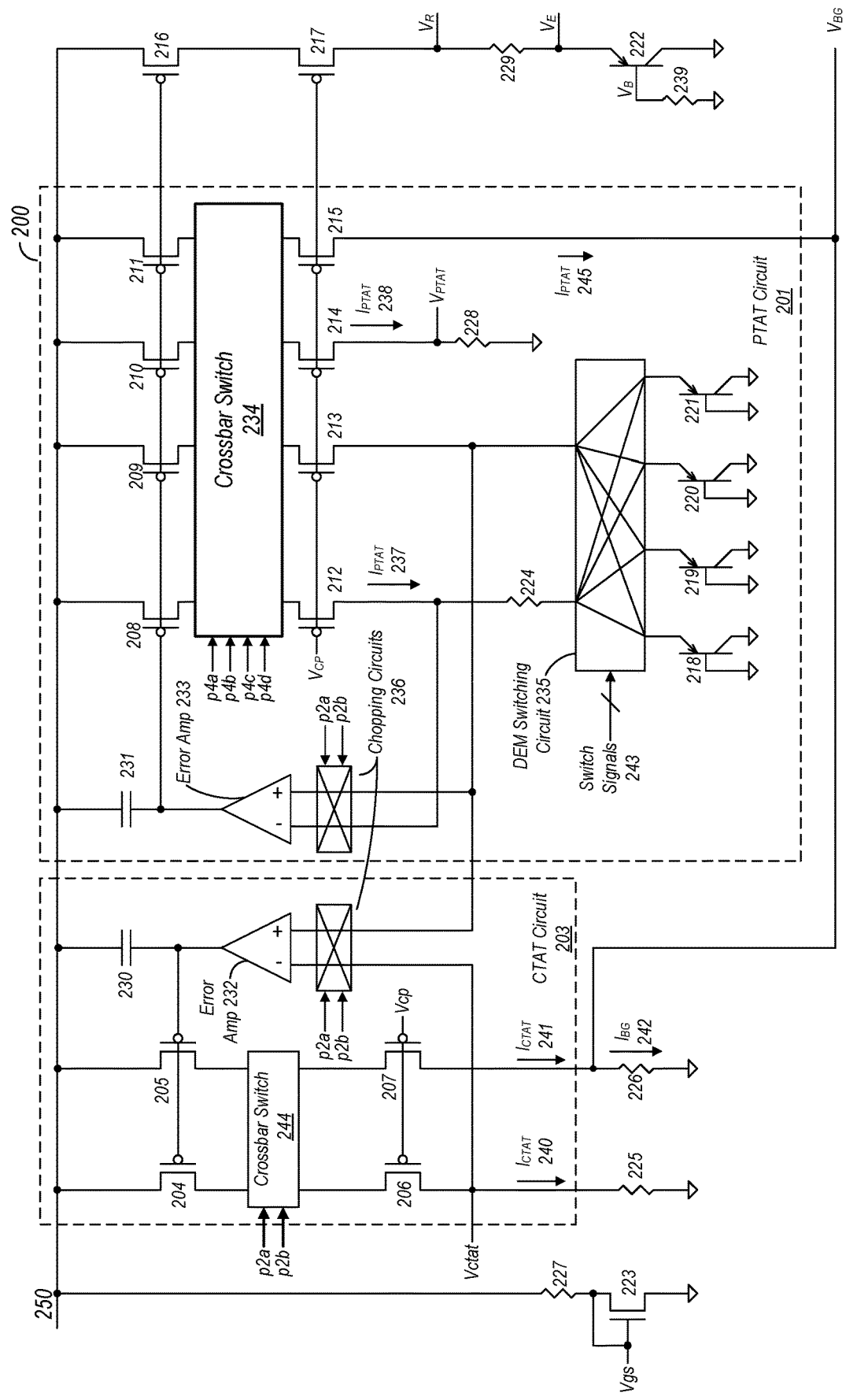
FIG. 2 illustrates a block diagram of an embodiment of a sensor circuit.

Turning to FIG. 2, a block diagram of an embodiment of a sensor circuit is depicted. In various embodiments, sensor circuit 200 may correspond to any of sensor circuits 102A-102B. As illustrated, sensor circuit 200 is a $\Delta V_{BE}$-type temperature sensor, and may be subdivided into a proportional to absolute temperature circuit (denoted as "PTAT circuit 201," and a complementary to absolute temperature circuit (denoted as "CTAT circuit 203"). These circuits are coupled to one another in a manner to generate analog signals based on the difference between selected ones of the devices 218-221. Although not explicitly shown here (for the sake of simplicity), sensor circuit 200 may also include an amplifier circuit configured to amplify $\Delta V_{BE}$ between the various circuit branches to generate analog indications of temperature that can be converted into a digital format. Temperatures in sensor circuit 200 may be measured over a number of temperature cycles. As will be discussed below, the couplings between different devices in the embodiment of FIG. 2 may be changed on a cycle-by-cycle basis.

In the embodiment shown, sensor circuit 200 may use devices 218-221 to generate both PTAT and bandgap voltages. In various embodiments, devices 218-221 may be implemented as PNP bipolar transistors, or any other suitable bipolar device. Furthermore, utilizing techniques such as dynamic element matching (DEM) and chopping, a significantly lower number of bipolar devices may be used, thereby enabling a highly compact sensor.

PTAT circuit 201 includes a number of circuit branches that implement current mirrors. A crossbar switch 234 may be used to cross-couple various devices to one another during operation. These cross-couplings may be changed on a cycle-by-cycle basis. First and second circuit branches in the embodiment shown include devices 212 and 213, which are each coupled to provide a portion of the current to devices 218-221. Devices 214 and 215, are implemented in third and fourth circuit branches, respectively. Devices 212-215 may be implemented as p-channel metal-oxide semiconductor field-effect transistors (MOSFETs), FinFETs, gate-all-around FETs (GAAFETs), or other suitable transconductance devices. Devices 212-215 can include respective gate terminals coupled to receive bias voltage $V_{CP}$, which may be generated by other voltage generation circuitry not shown here.

Devices 208-211 may be used to form current mirrors. In various embodiments, devices 208-211 may be implemented as p-channel MOSFETs, FinFETs, or GAAFETs, each of which include a gate terminal coupled to the output of error amplifier 233. The particular circuit branch to which each of these devices is coupled to during any given cycle is dependent upon crossbar switch 234, and the signal provided thereto (p4a, p4b, p4c, and p4d). The states of these signals may change on a cycle-by-cycle basis, and thus the couplings between the transistors of the various circuit branches may correspondingly change. Crossbar switch 234 in the embodiment shown may enable the coupling of any of devices 212-215 to any of devices 208-211.

A drain terminal of device 212 in the embodiment shown is coupled to resistor 224, which in turn is coupled to another crossbar switch, labeled here as DEM switching circuit 235. PTAT current $I_{PTAT}$ 237 flows through this circuit branch. Meanwhile, the drain terminal of device 212 is coupled directly to an input of DEM switching circuit 235. The drain terminal of device 214 is coupled to an output node on which PTAT voltage $V_{PTAT}$ is generated. The drain terminal of device 214 is further coupled to resistor 228, whose other terminal is coupled to ground. A drain terminal of device 215 is coupled to a bandgap voltage node $V_{BG}$.

Drain terminals of devices 212 and 213 are used to provide inputs to error amplifier 233. In the illustrated embodiment, signals from these nodes are fed to the error amplifier 233 via a chopping circuit 236, which is used to minimize or eliminate any unwanted offset voltages on these nodes. The configuration of chopping circuit 236 on any given cycle in the embodiment shown is dependent on signals p2a and p2b. As noted above, the output of error amplifier 233 is coupled to respective gate terminals of devices 208-211. Additionally, the output of error amplifier 233 is also coupled to capacitor 231, which, in turn, is coupled to power supply node 250. Capacitor 231 may filter out AC noise and provide stability for the feedback loop. In various embodiments, capacitor 231 may be implemented as a metal-oxide-metal (MOM), a metal-insulator-metal (MIM), or any other suitable capacitor structure.

Current mirrors are formed in PTAT circuit 201 by the loop that includes error amplifier 233. The particular transistors forming the current mirrors may change from one cycle to the next by the switching of crossbar 234. In particular, crossbar 234 implements dynamic element matching in the current mirrors by, on successive cycles, coupling different ones of devices 208-211 to ones of devices 212-215. Furthermore, different ones of the group of devices crossbar 234 may be coupled to provide currents (such as $I_{PTAT}$ 237) to the circuit legs below the crossbar 234. Switching the device couplings each cycle may thus minimize errors that could otherwise be induced by mismatches in the various transistors by averaging these errors out over time.

CTAT circuit 203 includes error amplifier 232, which includes another instance of chopping circuit 236 on its respective inputs. Chopping circuit 236 is coupled to receive one input from PTAT circuit 201 (in particular, from the branch including device 213), and another input from the node upon which $V_{CTAT}$ is generated. The output of error amplifier 232 is coupled to capacitor 230 which provides AC coupling to the local voltage supply node. In various embodiments, capacitor 230 may be implemented as a metal-oxide-metal (MOM), a metal-insulator-metal (MIM), or any other suitable capacitor structure.

In various embodiments, devices 204-207 may be implemented as p-channel MOSFETs. As illustrated, gate terminals of devices 204 and 205 are coupled to the output of error amplifier 232. Crossbar switch 244 is coupled to the drain terminals of devices 204 and 205, and is further coupled to source terminals of devices 206 and 207, the latter two having respective gate terminals coupled to receive the bias voltage $V_{CP}$. Crossbar switch 244 may implement additional dynamic element matching in the circuit by alternately coupling devices 204 and 205 to the circuit branches of 206 and 207, depending on respective states of the input signals p2a and p2b. The arrangement of CTAT circuit 203 forms a current mirror in which the current $I_{CTAT}$ 240 is mirrored from the branch of device 206 as $I_{CTAT}$ 241 in the branch of device 207.

DEM switching circuit 235 couples two of the circuit branches (those including devices 212 and 213) to respective collectors of devices 218-221. In one embodiment, for a given cycle, DEM switching circuit 235 may select a subset of devices 218-221 to be coupled to the circuit branch including resistor 224, while a second subset of devices 218-221 is coupled to the circuit branch of device 213. The subset may vary in size, and may be as few as one device.

For example, in a given cycle, with n devices, n−1 devices may be coupled to the circuit branch of resistors 224, while one of the devices may be coupled to the circuit branch of device 213. In a next cycle, these subsets may be changed, with at least one device of a given subset being coupled to the opposite circuit branch from the previous cycle.

The switching of DEM switching circuit 235 is controlled by switch signals 243. The pattern in which 218-221 are selected to be coupled to respective ones of the first and second circuit branches may, in one embodiment, be carried out in a pre-determined manner. This may result in a predictable averaging out of the mismatch-induced error. In another embodiment, the switching may be randomized to cause a corresponding randomization of error that would otherwise occur due to device mismatches.

As illustrated, a PTAT current, $I_{PTAT}$ 237, is generated by the $\Delta V_{BE}$ across resistor 227, with the $\Delta V_{BE}$ being the difference in the base-emitter voltages in the first and second subsets of devices 218-221 in a given measurement cycle. This current is mirrored, at $I_{PTAT}$ 238, to the circuit branch containing device 214 and resistor 228. The mirrored current $I_{PTAT}$ 238 is passed through resistor 228 to generates the PTAT voltage, $V_{PTAT}$. The value of $V_{PTAT}$ can be determined using Equation 2, where $R_{228}$ is the value of resistor 228 and $R_{227}$ is the value of resistor 227.

$$V_{PTAT} = \frac{R_{228}}{R_{227}} \Delta V_{BE} \quad (2)$$

As shown in Equation 2, $V_{PTAT}$ is scaled by the ratio of resistors 227 and 228. Furthermore, since $V_{PTAT}$ voltage depends on the value of $\Delta V_{BE}$, it is indicative of a temperature of sensor circuit 200. Accordingly, this voltage may be provided to either an amplifier and then to an analog-to-digital converter circuit, or directly to an analog-to-digital converter circuit, for conversion to digital in order to relay the sensed temperature value to control circuit 101.

It is noted that the number of bipolar transistors coupled to DEM switching circuit 235 is intended to be illustrative rather than limiting. The exact number used may vary from one embodiment to another, although this number may nevertheless be smaller than the numbers used for typical implementations of a $\Delta V_{BE}$-type temperature sensor. In one embodiment, the number of bipolar transistors may be as few as three, with one of the bipolar transistors (or transistor groups) being larger than the other. More generally, the selection of bipolar transistors may be made such that the current density in one leg of the circuit is different than the other. This may be accomplished by having the same current in bipolar transistors of different sizes, having the same size bipolar transistors with different bias currents, or any other suitable arrangement.

$I_{PTAT}$ 237 is also mirrored as $I_{PTAT}$ 245 through the circuit branch containing device 215. In CTAT circuit 203, $I_{CTAT}$ 240 flows through device 206 and resistor 225 to a CTAT voltage ("$V_{CTAT}$"). $I_{CTAT}$ 240 is mirrored as $I_{CTAT}$ 241 in the circuit branch of CTAT circuit 203 including device 207. $I_{CTAT}$ 241 is summed with $I_{PTAT}$ 245 to form a bandgap current, $I_{BG}$, which is passed through resistor 226 to generate a bandgap reference voltage $V_{BG}$.

In addition to measurement of PTAT and CTAT parameters, sensor circuit 200 also allows for the extraction of a MOSFET threshold value, which may be used in conjunction with other physical parameters to determine operating characteristic 104. In various embodiments, device 223 may be implemented as an n-channel MOSFET that is coupled between resistor 227 and a ground supply node. Resistor 227 is further coupled to power supply node 250, and the gate terminals of device 223 is also coupled to resistor 227. As current flows from power supply node 250 through resistor 227 into device 223, the voltage drop across device 223, which corresponds to its threshold voltage, can be measure at node $V_{GS}$. It is noted that a complement version of this circuit may be employed to measure the threshold voltage of a p-channel MOSFET. In various embodiments, resistor 227 may be implemented using polysilicon, metal, or any other suitable layer available on a semiconductor manufacturing process.

Sensor circuit 200 may also be used to determine a value of β using resistors 229 and 239, and devices 216, 217, and 222. In various embodiments, devices 216 and 217 may be implemented as p-channel MOSFETs, and device 222 may be implemented as a PNP bipolar transistor. Resistors 229 and 239 may be implemented using polysilicon, metal, or any other suitable layer available on a semiconductor manufacturing process.

Device 216 is coupled between power supply node 250 and device 217. A gate terminal of device 216 is coupled to the output of error amplifier 233. Device 217 is coupled between device 216 and resistor 229. A gate terminal of device 217 is coupled to bias voltage $V_{CP}$. Resistor 229 is coupled between device 217 and device 222, which is further coupled to a ground supply node. A base terminal of device 222 is coupled to the ground supply node via resistor 239.

$I_{PTAT}$ 237 is mirrored by device 217, causing a version of $I_{PTAT}$ 237 to flow through resistor 229 and into device 222. A voltage level may be set on node $V_B$ (e.g., 70 mV) and the voltages at nodes $V_R$ and $V_E$ may then be measured. A value of the β of device 222 may be determined using Equation 3.

$$\beta = \frac{(V_R - V_E)}{V_B} \quad (3)$$

Figure 3A:
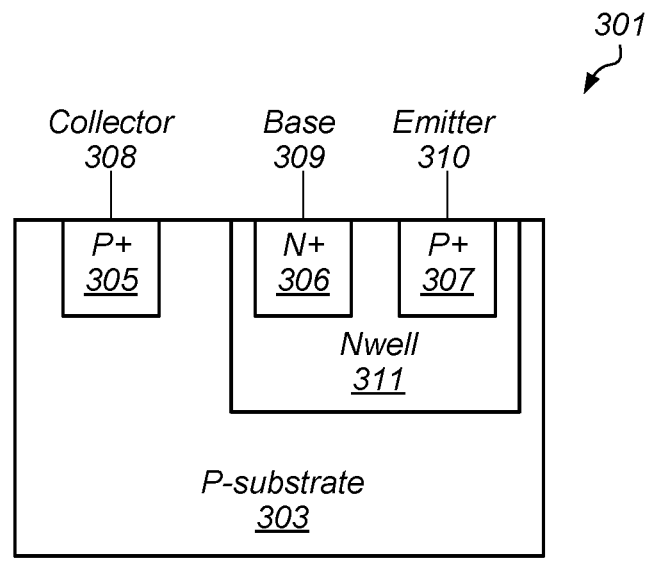
FIG. 3A illustrates a block diagram of an embodiment of a bipolar device.

The circuit depicted in FIG. 2 employs multiple bipolar devices. In some cases, a bipolar complementary metal-oxide semiconductor ("BiCMOS") process may be used to manufacture sensor system 100. In such cases, vertical bipolar devices with alternating layers of p-type and n-type silicon may be available for use in circuits such as the circuit depicted in FIG. 2. Alternatively, bipolar devices may be fabricated using lateral bipolar devices on a standard complementary metal-oxide semiconductor ("CMOS") process. An embodiment of a lateral bipolar device for use with a CMOS process is depicted in FIG. 3A. As illustrated, bipolar device 301 is a PNP bipolar transistor with collector, base, and emitter terminals labeled collector 308, base 309, and emitter 310, respectively.

Bipolar device 301 is fabricated on p-substrate 303. In various embodiments, p-substrate 303 is a doped version of intrinsic silicon. Collector 308 includes region P+305 which is implanted into p-substrate 303. In some embodiments, additional dopant atoms (e.g., boron atoms) are implanted into a particular region of p-substrate to form region P+305.

Base 309 and emitter 310 are formed in NWELL 311, which is formed by implanting n-type dopant atoms (e.g., phosphorous atoms) into a given region of p-substrate 303. To connect to NWELL 311, region N+306 is formed by implanting additional dopant atoms into a given region of NWELL 311. Region N+306 forms the base terminal of bipolar device 301. In a similar fashion, p-type dopant atoms are implanted in a different region of NWELL 311 to form region P+307 which is the emitter terminal of bipolar device 301. A lateral PNP device is formed by region P+305, NWELL 311, and region P+307.

Figure 3B:
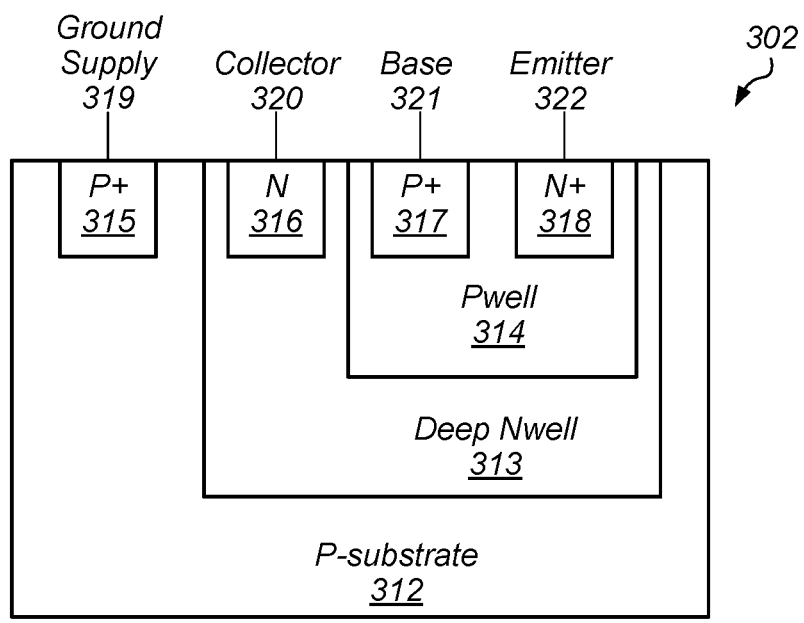
FIG. 3B illustrates a block diagram of another embodiment of a bipolar device.

Turning to FIG. 3B, another embodiment of a lateral bipolar transistor is depicted. In this case, by employing deep NWELL 313, into which PWELL 314 is implanted, a lateral NPN transistor is formed whose terminals include collector 320, base 321, and emitter 322. Collector 320 is coupled to deep NWELL 313 via region N 416, which is implanted into deep NWELL 313.

PWELL 314 is fabricated into deep NWELL 313 through the addition of p-type dopant atoms into a region of deep NWELL 313. Base 321 is coupled to PWELL 314 via region P+317, which is implanted into PWELL 314 through the implantation of additional p-type dopant atoms. Region N+318 forms emitter 322 of bipolar device 302. In various embodiments, region N+318 may be fabricated by implanting n-type dopant atoms into a region of PWELL 314.

It is noted that either of bipolar devices 301 or 302 may be employed as devices 218-222 in the circuit depicted in FIG. 2. Although FIGS. 3A and 3B depicted two types of bipolar devices, other structures may be used to fabricate bipolar devices for use in sensor circuits.

Figure 4A:
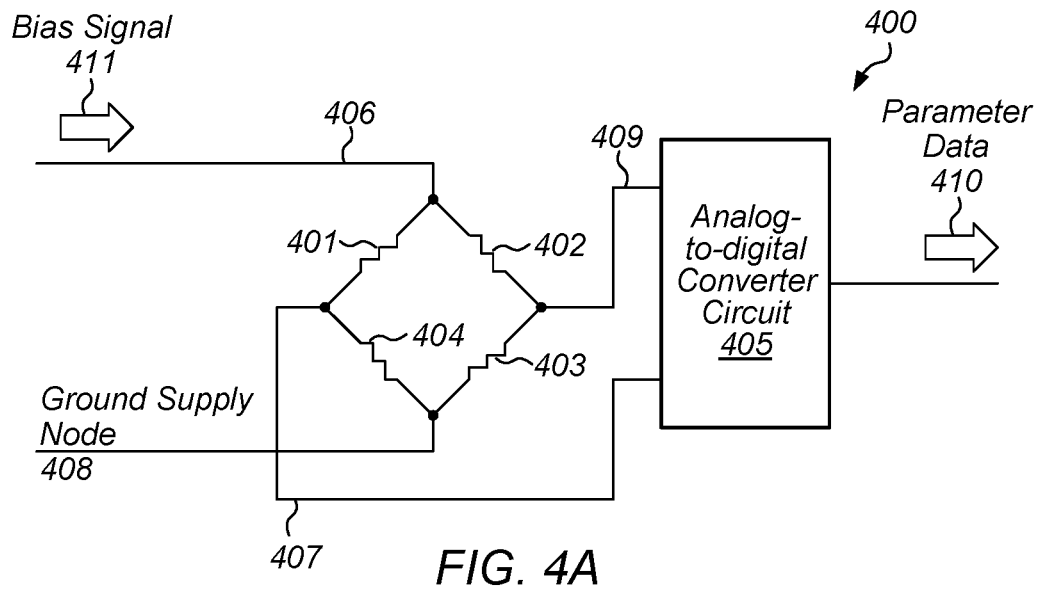
FIG. 4A is a block diagram of a different embodiment of a resistor-based sensor circuit.

A block diagram of an embodiment of a resistor sensor circuit is depicted FIG. 4. In various embodiments, sensor circuit 400 may correspond to any of sensor circuits 102A-102B as depicted in FIG. 1 and is configured to generate parameter data 410 that can be used to determine temperature. As illustrated, sensor circuit 400 includes resistors 401-404 and analog-to-digital converter circuit 405.

Resistor 401 is coupled between node 406 and node 407, while resistor 402 is coupled between node 406 and node 409. Resistor 404 is coupled between node 407 and ground supply node 408, while resistor 403 is coupled between node 409 and ground supply node 408. Analog-to-digital converter circuit 405 is coupled to nodes 407 and 409, and bias signal 411 is injected into node 406. In various embodiments, bias signal 411 may be a DC voltage level. In such cases, the DC voltage may be applied between nodes 406 and ground supply node 408.

In various embodiments, different ones of resistors 401-404 may be fabricated with different materials. For example, resistors 401 and 403 may be fabricated using a metal (e.g., aluminum) available on a semiconductor manufacturing process, while resistors 402 and 404 may be fabricated using polysilicon. In some embodiments, the temperature coefficients of resistors 401 and 403 may be different than the temperature coefficients of resistors 402 and 404. In some cases, the temperature coefficients of resistors 401 and 403 may be positive (i.e., the value of the resistors increases as temperature increases), and the temperature coefficients of resistors 402 and 404 may be negative (i.e., the value of the resistors decreases as temperature increases).

The value of resistors 401 and 403 can be determined using Equation 4, where $R_1$ is the value of either of resistors 401 or 403, $R_{ref1}$ is the reference resistance (measured at the reference temperature) of either of resistors 401 or 403, $tc_1$ is the temperature coefficient of the material used to fabricate resistors 401 and 403, T is the temperature, and $T_{ref}$ is the reference temperature at which $R_{ref1}$ was measured.

$$R_1 = R_{ref1}[1 + tc_1(T - T_{ref})] \quad (4)$$

The value of resistors 402 and 404 can be determined using Equation 5, where $R_2$ is the value of either of resistors 402 or 404, $R_{ref2}$ is the reference resistance (measured at the reference temperature) of either of resistors 402 or 404, $tc_2$ is the temperature coefficient of the material used to fabricate resistors 402 and 404, T is the temperature, and $T_{ref}$ is the reference temperature at which $R_{ref2}$ was measured.

$$R_2 = R_{ref2}[1 + tc_2(T - T_{ref})] \quad (5)$$

Based on the topology of sensor circuit 400, the voltage, as a function of temperature, across nodes 407 and 409 can be expressed based on the values of resistors 401-404. Using Equations 4 and 5, the voltage across nodes 407 and 409 can be expressed as shown in Equation 6, where $V_{bias}$ is the voltage of bias signal 411 and $V_{out}(T)$ is the voltage across nodes 407 and 409.

$$V_{out}(T) = V_{bias}\left(\frac{R_1}{R_1 + R_2} + \frac{R_2}{R_1 + R_2}\right) \quad (6)$$

Since the value of $V_{bias}$ is known, along with the reference values of resistors 401-404, and the voltage across nodes 407 and 408 can be measured, the temperature of the resistors can be determined using a function (e.g., function 105) as depicted in Equation 7.

$$T = f(V_{out}(T), R_{ref1}, R_{ref2}) \quad (5)$$

Analog-to-digital converter circuit 405 is configured to generate parameter data 410 using respective voltage levels of nodes 407 and 409. It is noted that parameter data 410 may, in some embodiments, correspond to one of physical parameters 103A-C, and may be used by control circuit 101 to determine operating characteristic 104. It is further noted that in some embodiments, analog-to-digital converter circuit 405 may be omitted, and the respective voltage levels of nodes 407 and 409 routed to control circuit 101.

In various embodiments, analog-to-digital converter circuit 405 may be implemented as a direct-conversion analog-to-digital converter circuit, a successive-approximation analog-to-digital converter circuit, or any other suitable analog-to-digital converter circuit topology. A number of bits included in parameter data 410 may be determined based on a desired accuracy of operating characteristic 104. For example, an increase in the accuracy of operating characteristic 104 may necessitate an increase in the number of bits included in parameter data 410. In such cases, the topology of analog-to-digital converter circuit 414 may be adjusted to provide the desired number of bits.

As described above, sensor circuit 400 employs multiple resistors fabricated with different materials. As described above, a temperature value may be determined using information from sensor circuit 400 and employing a function that includes weights that are generated using machine-learning or other suitable algorithms. To employ such algorithms, additional characteristics (e.g., the reference values of resistors 401-404) need to be determined.

Figure 4B:
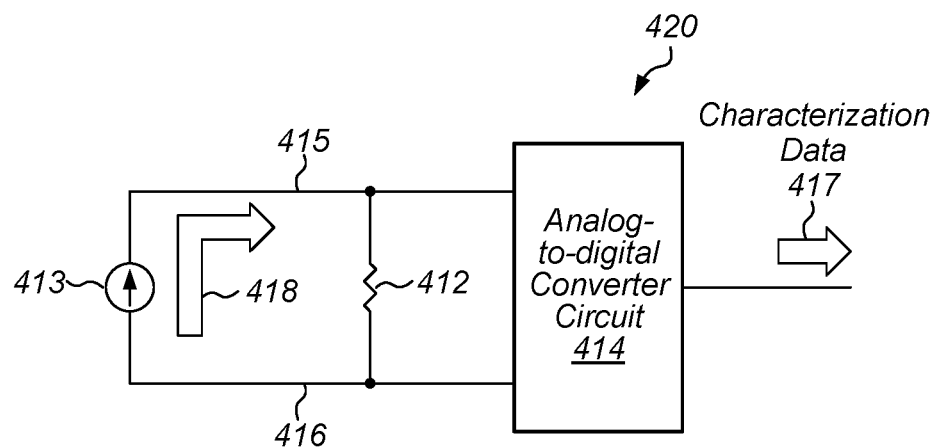
FIG. 4B is a block diagram of an embodiment of a characterization circuit.

During manufacture, the values of resistors 401-404 may vary from one integrated circuit chip to another. Given such variation, a given integrated circuit chip can employ characterization circuits to determine characteristics of particular devices, resistors, etc. A block diagram of such a characterization circuit is depicted in FIG. 4B. As illustrated, characterization circuit 420 includes resistor 412, current source 413, and analog-to-digital converter circuit 414.

Resistor 412 is coupled between nodes 415 and 416. In various embodiments, resistor 412 may be a replica of any of resistors 401-404. As used herein, a replica resistor is a different instance of another resistor and is designed and fabricated to have similar electrical characteristics. In some cases, a resistor and its replica may use similar mask design so the resistor and its replica have similar physical characteristics. It is noted that although only a single resistor is depicted in the embodiment of FIG. 4B, in other embodiments, characterization circuit 420 may be configured to determine characterization data for multiple replica resistors.

Current source 413 is configured to generate current 418, which flows through resistor 412. As current 418 flows through resistor 412, a voltage is developed across resistor 412, resulting in the voltage levels of nodes 415 and 416 being different. A value of resistor 412 can be determined using the voltage levels of nodes 415 and 416, and a value of current 418. In various embodiments, current source 413 may be implemented as a biased device that is part of a current mirror or other suitable circuit.

Analog-to-digital converter circuit 414 is configured to generate characterization data 417 using respective voltage levels of nodes 415 and 416. In some embodiments, characterization data 417 may correspond to a voltage drop across resistor 412, which may be used as a reference value for a particular type of resistor (e.g., metal, polysilicon, etc.). It is noted that characterization data 417 may, in some embodiments, be used by control circuit 101 to determine operating characteristic 104. In some embodiments, control circuit 101 may be further configured to determine a value for resistor 412 using characterization data 417 and a value of current 418. As described above, values of resistors 401-404, or their replicas (e.g., resistor 412), may be used in conjunction with a machine-learning algorithm to improve an accuracy of a temperature determined by sensor circuit 400.

In various embodiments, analog-to-digital converter circuit 414 may be implemented as a direct-conversion analog-to-digital converter circuit, a successive-approximation analog-to-digital converter circuit, or any other suitable analog-to-digital converter circuit topology. A number of bits included in characterization data 417 may be determined based on a desired accuracy of operating characteristic 104. For example, an increase in the accuracy of operating characteristic 104 may necessitate an increase in the number of bits included in characterization data 417. In such cases, the topology of analog-to-digital converter circuit 414 may be adjusted to provide the desired number of bits.

Figure 5:
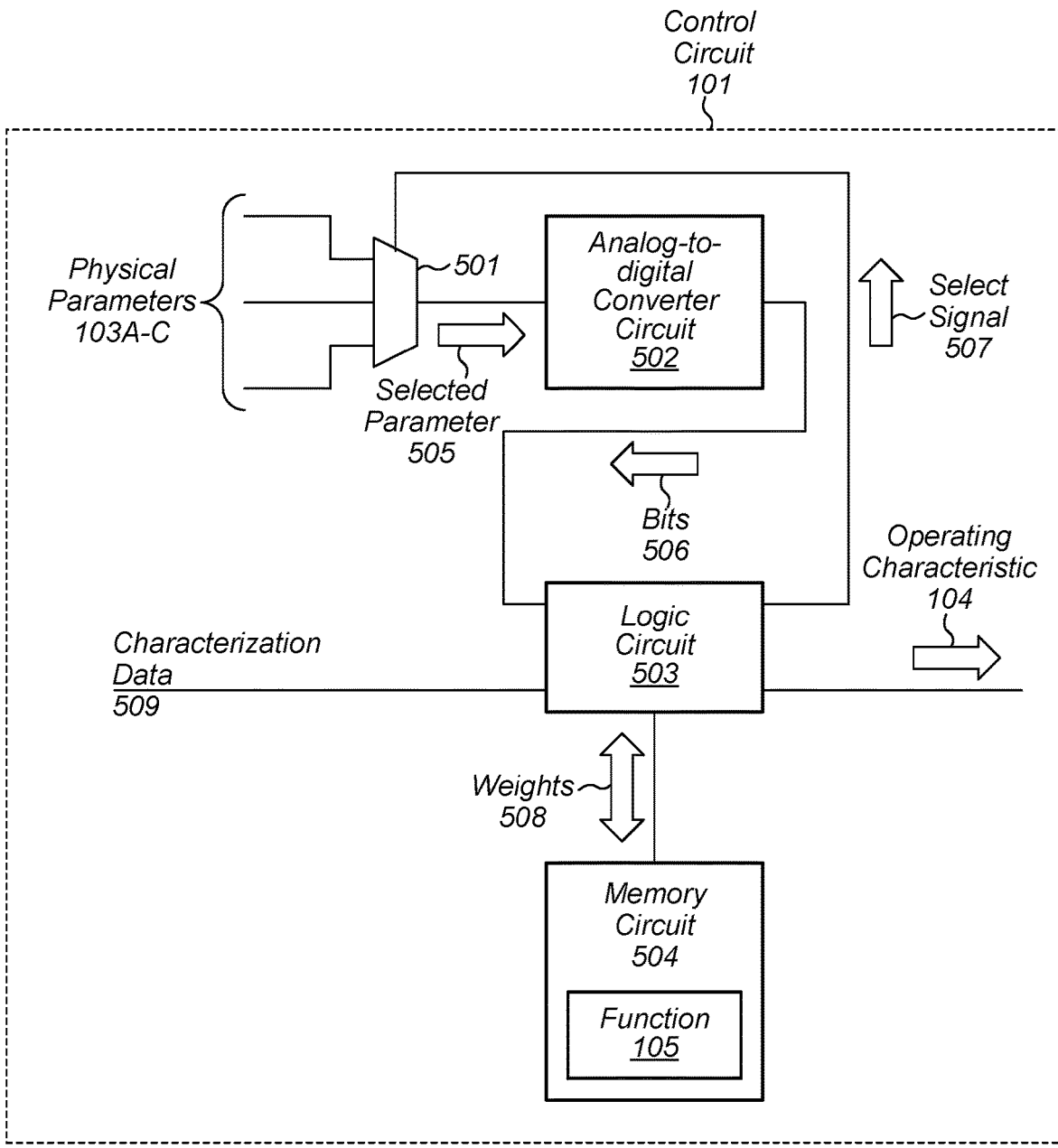
FIG. 5 is a block diagram of an embodiment of a control circuit.

Turning to FIG. 5, an embodiment of control circuit 101 is depicted. As illustrated, control circuit 101 includes multiplex circuit 501, analog-to-digital converter circuit 502, logic circuit 503, and memory circuit 504.

Multiplex circuit 501 is configured to select, using select signal 507, different ones of physical parameters 103A-103C to generate selected parameter 505. In various embodiments, different ones of physical parameters 103A-103C may be selected for different periods of time. The duration of how long a particular one of physical parameters 103A-103C are selected may be based on a time period needed by analog-to-digital circuit 502 to digitize selected parameter 505 to generate bits 506.

Analog-to-digital converter 502 is configured to generate bits 506 using selected parameter 505. In various embodiments, analog-to-digital converter circuit 502 may be implemented as a direct-conversion analog-to-digital converter circuit, a successive-approximation analog-to-digital converter circuit, or any other suitable analog-to-digital converter circuit topology. A number of bits included in bits 506 may be determined based on a desired accuracy of operating characteristic 104. For example, an increase in the accuracy of operating characteristic 104 may necessitate an increase in the number of bits included in bits 506. In such cases, the topology of analog-to-digital converter circuit 502 may be adjusted to provide the desired number of bits. It is noted that in cases where physical parameters 103A-103C are provided to control circuit 101 in a digital format, analog-to-digital converter circuit 502 may be omitted.

During a calibration mode, logic circuit 503 is configured to determine weights 508 based on data indicative of physical parameters 103A-103C (e.g., bits 506), or using characterization data 509. In some cases, characterization data 509 may include predetermined values for weights 508. To generate weights 508, logic circuit 503 may be further configured to perform minimum mean square error linear regression or any other suitable machine-learning algorithm to determine a correlation between physical parameters 103A-103C and operating characteristic 104. In some cases, to reduce circuit complexity, a significance level may be assigned to use a forward selection, backward elimination, or stepwise selection algorithm. The significance level and algorithm selection may, in various embodiments, be under user control external to control circuit 101.

During a mission mode, logic circuit 503 is configured to combine bits 506 with weights 508 to generate a value for operating characteristic 104. In various embodiments, to combine bits 506 with weights 508, logic circuit 503 may be further configured to multiply bits 506 associated with a given one of physical parameters 103A— C with a corresponding one of weights 508 to generate a given one of a plurality of product terms. Logic circuit 503 may be further configured to add the plurality of product terms to generate the value for operating characteristic 104. In some embodiments, control circuit 503 may be further configured to retrieve particular ones of weights 508 from memory circuit 504, and to change a value of select signal 507 to allow different signals corresponding to different ones of physical parameters 103A-C to be digitized by analog-to-digital converter circuit 502 for use in generating the plurality of product terms.

Logic circuit 503 is configured to generate select signal 507. In various embodiments, select signal 507 may include multiple bits, each corresponding to a different one of physical parameters 103A-103C. In various embodiments, logic circuit 503 may be configured to sequentially activate each of the bits included in select signal 507 in order to select different ones of physical parameters 103A-103C. In some embodiments, a duration of how long a given one of the bits included in select signal 507 is activated may be based on a time needed for analog-to-digital converter circuit 502 to digitize selected parameter 505 to generate bits 506.

Logic circuit 503 may include multiple adder and multiplication circuits, as well as state machines or other sequential logic circuits. Additionally, logic circuit 503 may include storage circuits (e.g., register files, memory circuits, etc.) to store the plurality of products terms prior to performing an addition operation using the plurality of product terms. In other embodiments, logic circuit 503 may be implemented as a general-purpose processor configured to execute program instructions in order to perform the desired operations.

Memory circuit 504 is configured to store data indicative of weights 508 and function 105. In various embodiments, memory circuit 504 may be implemented as a static random-access memory (SRAM) circuit, or any other suitable memory circuit. In some cases, memory circuit 504 may include non-volatile data storage cells (e.g., flash memory cells) or one-time programmable memory cells configured to store the data indicative of weights 508 and function 105.

Figure 6:
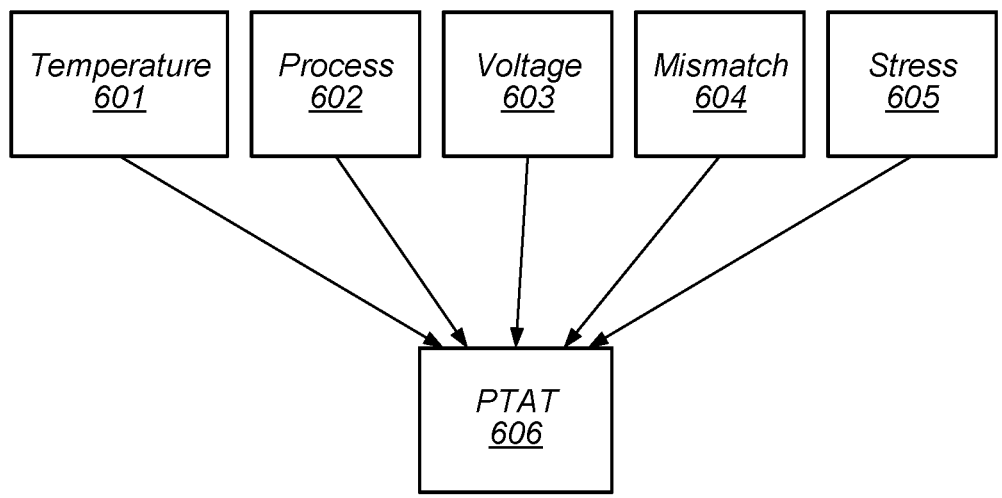
FIG. 6 is a block diagram depicting parameters affecting temperature measurement in an integrated circuit.

As noted above, to measure the temperature of an integrated circuit, a current (or voltage) that is proportional to absolute temperature may be generated. Such a current (or voltage) is not only affected by the temperature, but is also affected by physical parameters associated with the integrated circuit. An example of the parameters that can affect the PTAT current (or voltage) is depicted in FIG. 6.

As illustrated, PTAT 606 is affected by temperature 601, process 602, voltage 603, mismatch 604, and stress 605. It is noted that PTAT 606 may be either a current or a voltage, and may be determined using a sensor circuit as described above. Although PTAT 606 is shown as being affected by five parameters, there may be additional parameters that can affect the value of PTAT 606.

PTAT 606 is affected by temperature 601 such that as temperature 601 increases or decreases, the value of PTAT 606 also changes in a linear fashion. By using the linear relationship between PTAT 606 and temperature 601, a value for temperature 601 may be determined once a value for PTAT 606 is known.

Additionally, PTAT 606 is affected by process 602, which can include variation in electrical characteristics of devices in an integrated circuit resulting from manufacture. Such variation may be the result of different dopant levels, differences in lithography, and the like. In some cases, the variation may be from one integrated circuit to another, while in other cases, the variation may be localized to a particular integrated circuit, resulting in variation from one device to another.

Voltage 603 may also affect the value of PTAT 606. As described above, a circuit that generates a PTAT current (or voltage) relies on a voltage level of a power supply node on the integrated circuit. While certain circuit design techniques can lessen the effect of the voltage level of the power supply node, there may still be some variation in PTAT 606 resulting from changes in the voltage level of the power supply node.

In some circuits, devices with similar characteristics are employed. Such devices are referred to as "matched devices." To achieve similar characteristics, the devices may be designed with similar artwork in hopes that the devices, once manufactured, will have the desired electrical characteristics. As described above, differences in manufacturing can result in variation from one device to another within an integrated circuit. When such variation occurs between matched devices, the variation is referred to as "mismatch." In some embodiments, a circuit configured to generate PTAT 606 may employ one or more pairs of matched devices. As a result, mismatch between such devices (denoted as "mismatch 604") can affect the value of PTAT 606.

Silicon used as a substrate for manufacturing integrated circuits has a crystalline structure. When silicon is subjected to mechanical stress, the crystalline lattice of the silicon can deform resulting in changes in the electrical characteristics of the silicon. Mechanical stress can be the result of thermal mismatch between the silicon of an integrated circuit and a substrate, circuit board, or other material, to which the integrated circuit may be affixed. Changes in the electrical characteristics of the silicon can affect the operation of circuits fabricated on the silicon. As a result, PTAT 606 varies with stress 605.

Figure 7:
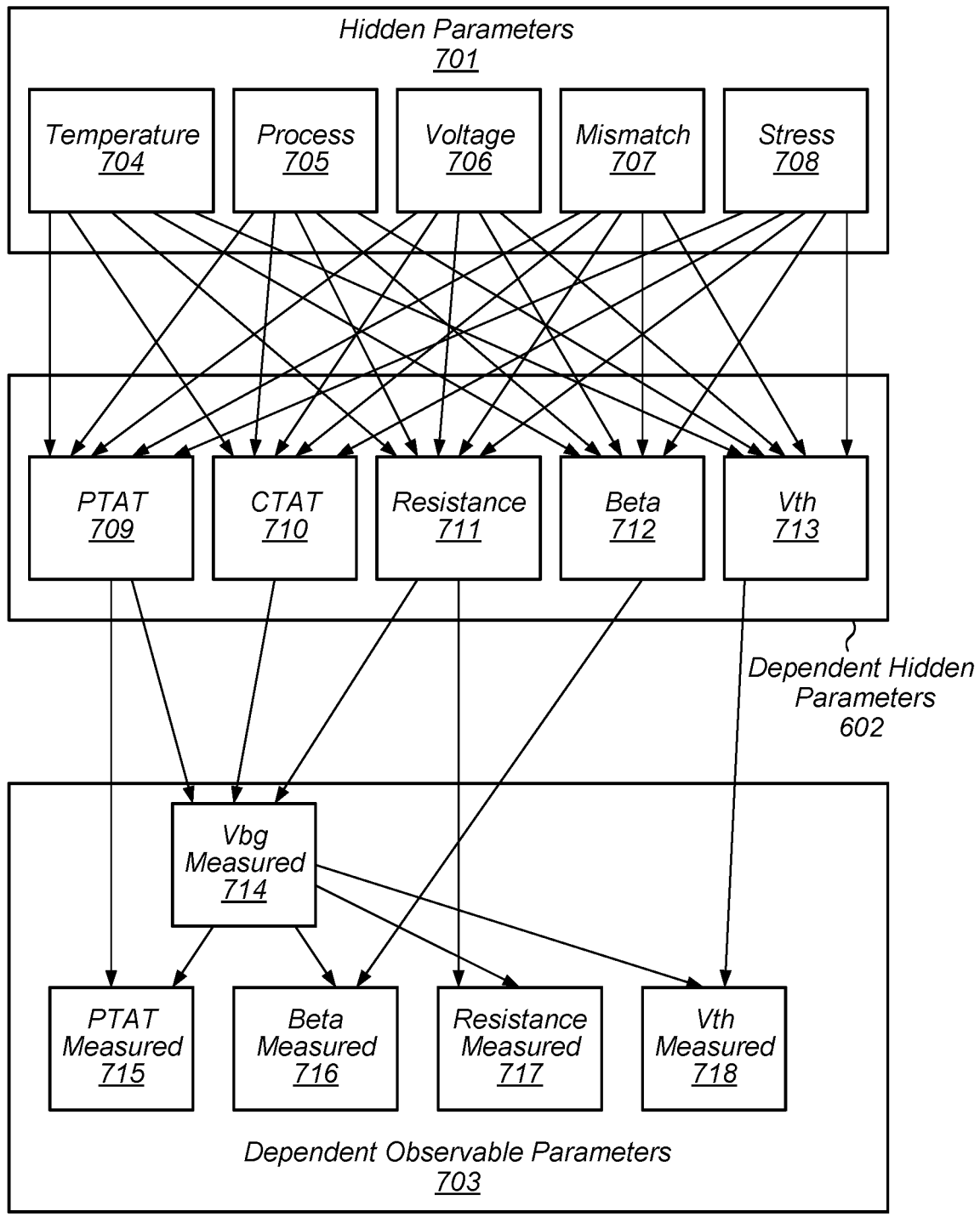
FIG. 7 is a block diagram depicting relationships between hidden random parameters, dependent hidden parameters, and dependent observable random parameters.

While FIG. 6 illustrates how multiple parameters can affect a PTAT current (or voltage), many more interactions between physical parameters are possible. A block illustrating such interactions is depicted in FIG. 7. As illustrated, the various parameters can be categorized as either hidden parameters, dependent hidden parameters, or dependent observable parameters.

Hidden parameters are physical parameters of an integrated circuit that are not directly measurable. As depicted in FIG. 7, hidden parameters 701 includes temperature 704, process 705, voltage 706, mismatch 707, and stress 708. The parameters include in hidden parameters 701 may affect other hidden parameters as well as observable parameters. In various embodiments, temperature 704, process 705, voltage 706, mismatch 707, and stress 708 may vary in a random fashion.

Additionally, there are other hidden parameters that depend on the parameters included in hidden parameters 701. These parameters are referred to as "dependent hidden parameters." As depicted in FIG. 7, dependent hidden parameters 702 include a PTAT current (or voltage) denoted as "PTAT 709," a current (or voltage) complementary to absolute temperature ("CTAT") denoted as "CTAT 710," resistance of polysilicon or other resistor layer denoted as "resistance 711," the β of bipolar devices denoted as "Beta 712," and the threshold voltage of a MOSFET denoted as "Vth 713." As illustrated, the parameters included in dependent hidden parameters 702 are dependent on each of the parameters in hidden parameters 701.

As described above, many observable parameters associated with an integrated circuit may be dependent on hidden, i.e., non-observable parameters. Dependent observable parameters 703 includes $V_{BG}$ measured 714, PTAT measured 715, beta measured 716, resistance measured 717, and Vth measured 718. It is noted that some of the parameters included in dependent observable parameters 703 may be "measured" versions of the actual values of the parameters as depicted in dependent hidden parameters 702.

As illustrated, $V_{BG}$ measured 714 is dependent on PTAT 709, CTAT 710, and resistance 711, while PTAT measured 715 is dependent on PTAT 709 and $V_{BG}$ measured 714. In a similar fashion, beta measured 716 is dependent on $V_{BG}$ measured 714 and Beta 712, while resistance measured 717 is dependent on $V_{BG}$ measured 714 and resistance 711. Lastly, Vth measured 718 is dependent on $V_{BG}$ measured 714 and Vth 713.

In other embodiments, each of hidden parameters 701, dependent hidden parameters 702, and dependent observable parameters 703 may include different numbers of parameters than what is depicted in FIG. 7. As described above, the relationship between the parameters included in dependent observable parameters 703 and an operating characteristic (e.g., temperature) of an integrated circuit may be determined using a machine learning algorithm, and that relationship may be used to determine a value of the operating characteristic of the integrated circuit during operation. It is noted that the operating characteristic of the integrated circuit may be one of hidden parameters 701.

Figure 8:
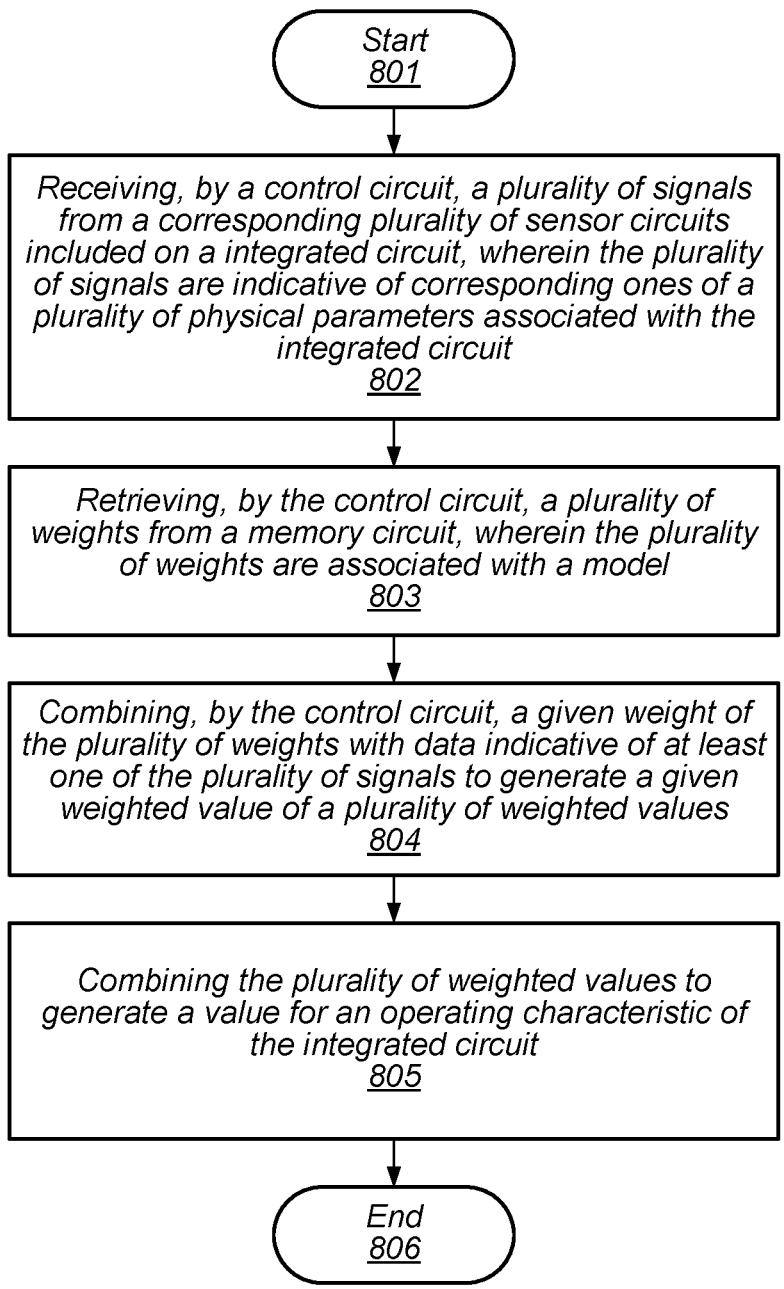
FIG. 8 illustrates a flow diagram depicting an embodiment of a method for operating a sensor circuit.

Turning to FIG. 8, a flow diagram depicting an embodiment of a method for operating a sensor circuit is illustrated. The method, which may be applied to sensor system 100, begins in block 801.

The method includes receiving, by a control circuit, a plurality of signals from a corresponding plurality of sensor circuits included on an integrated circuit (block 802). In various embodiments, the plurality of signals are indicative of corresponding ones of a plurality of parameters associated with the integrated circuit.

The method also includes retrieving, by the control circuit, a plurality of weights from a memory circuit, where the plurality of weights are associated with a model (block 803).

In some embodiments, the method may also include gathering, from one or more integrated circuits, characterization data indicative of the plurality of parameters, and training the model using the characterization data. In some cases, training (or re-training) the model using the characterization data includes determining the plurality of weights. Various techniques may be used to train (or re-train) the model including, but not limited to, multiple linear regression using backward elimination, forward selection, or any other suitable modeling technique.

In various embodiments, the method may further include determining a least significant parameter of the plurality of parameters, and removing the least significant parameter from the model. In such cases, the model may also include re-training the model using remaining ones of the plurality of parameters to generate an updated model, and determining an error associated with the updated model.

The method further includes combining, by the control circuit, a given weight of the plurality of weights with data indicative of at least one of the plurality of signals to generate a given weighted value of a plurality of weighted values (block 804). In some embodiments, combining the given weight with the data indicative of the at least one of the plurality of signals includes multiplying the given weight and the data indicative of the at least one of the plurality of signals to generate the given weighted value of the plurality of weighted values.

The method also includes combining the plurality of weighted values to generate a value for an operating characteristic of the integrated circuit (block 805). In some cases, the operating characteristic includes a temperature associated with the integrated circuit. In some embodiments, combining the plurality of weighted values includes adding the plurality of weighted values to generate the value of the operating characteristic of the integrated circuit. The method concludes in block 806.

Figure 9:
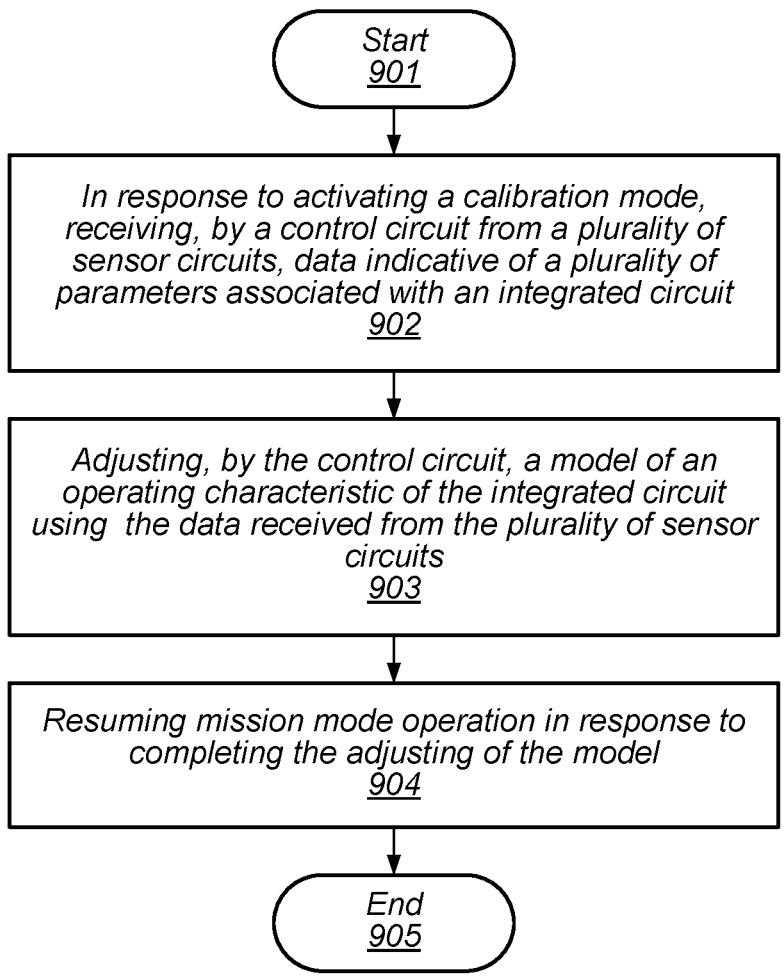
FIG. 9 illustrates a flow diagram depicting an embodiment of a method for adjusting a model during a calibration operation.

As described above, in some cases the model used to determine an operating characteristic of an integrated circuit may be prepared external to the integrated circuit using characterization data, and then loaded into the integrated circuit. Alternatively, the model may be prepared or updated by a control circuit included in the integrated circuit during a calibration mode. By allowing for the model to be generated or updated during the lifetime of the integrated circuit, changes over time, such as aging of transistors or other devices, can be comprehended and the model adjusted accordingly. A flow diagram depicting an embodiment of a method for adjusting such a model is illustrated in FIG. 9. The method, which may be applied to sensor system 100 as depicted in FIG. 1, begins in block 901.

The method includes, in response to activating a calibration mode, receiving by a control circuit from a plurality of sensor circuits, data indicative of a plurality of parameters associated with an integrated circuit (block 902). In some embodiments, the method may also include periodically activating the calibration mode in response to a given period of time elapsing. The method may further include, in some cases, activating the calibration mode in response to detecting a particular event (e.g., an interrupt signal), receiving an activation signal from a user, and the like.

The method further includes adjusting, by the control circuit, the model of an operating characteristic of the integrated circuit using the data received (block 903). In various embodiments, adjusting the model includes updating a plurality of weights associated with the model. In some cases, the method may include storing respective updated values for the plurality of weights in a memory circuit.

Adjusting the model may, in some embodiments, include re-training the model as described above.

The method also includes resuming mission mode operation in response to completing the adjusting of the model (block 904). In various embodiments, resuming mission mode includes determining a value for the operating characteristic of the integrated circuit as described above. The method concludes in block 905.

Figure 10:
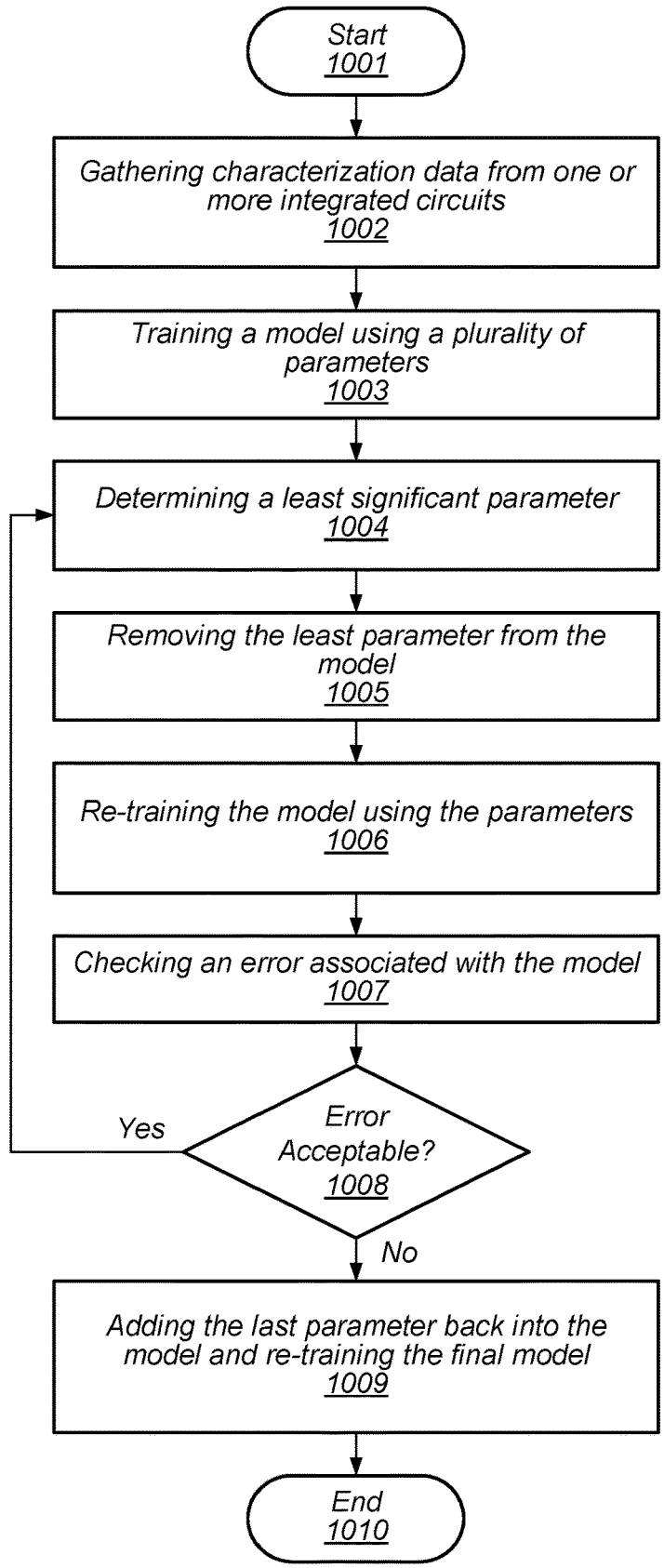
FIG. 10 illustrates a flow diagram depicting an embodiment of a method for generating a model for a sensor circuit.

As described above, various techniques may be employed to generate a model used to determine an operating characteristic of an integrated circuit. A flow diagram depicting an embodiment of a method for generating the model is illustrated in FIG. 10. The method, which may be applied to the sensor system depicted in FIG. 1, begins in block 1001.

The method includes gathering characterization data from one or more integrated circuits (block 1002). In various embodiments, the characterization data is indicative of a plurality of parameters (e.g., resistance value) associated with the integrated circuit. The plurality of parameters corresponds to a plurality of observable random variables that affect the determination of the operating characteristic of the integrated circuit.

The method also includes training a model using a plurality of parameters (block 1003). As described above, the characterization data may include data indicative of the plurality of parameters. In some embodiments, the plurality of parameters may correspond to observable random variables that affect a value of operating characteristic (e.g., temperature) of an integrated circuit that cannot be directly measure or "hidden" from direct measurement. In various embodiments, the model may be a linear regression model, and training the model may include determining one or more weight values associated with the model.

The method further includes determining a least significant parameter of the plurality of parameters (block 1004). In various embodiments, the values of the plurality of parameters may be changed, and the effect on the output of the model observed. The parameter whose value affects the output of the model by the least amount may be selected as the least significant parameter.

The method also includes removing the least significant parameter from the model (block 1005). In various embodiments, removing the least significant parameter may include setting a corresponding weight for the parameter to zero, or otherwise eliminating the contribution of the least significant parameter to the output of the model.

The method further includes re-training the model using the remaining parameters (block 1006). In some embodiments, re-training the model may include determining new values for the one or more weights associated with the model. Such re-training may employ linear regression or any other suitable technique for determining the weight values.

The method also includes checking an error associated with the model (block 1007). In various embodiments, the characterization data also includes expected values for an operating characteristic of the integrated circuit. In such cases, checking the error associated with the model may include comparing a predicted value of the operating characteristic generated using the model and its associated weight values to the expected values for the operating characteristic. In some embodiments, the error associated with the model may correspond to a difference between the predicted value and the expected value of the operating characteristic.

The method then depends on whether the error is acceptable (block 1008). If the error is acceptable, then the method continues from block 1004 as described above. Alternatively, if the error is not acceptable, then the method includes adding the last parameter back into the model and re-training the final model (block 1009). In some cases, the removal of the least significant parameter from the model may result in an error greater than a desired value. When this occurs, the most recently removed parameter is added back to the model. As described above, re-training may, in various embodiments, include performing a linear regression or other suitable algorithm using the updated set of parameters. The method concludes in block 1010. It is noted that the embodiment of the method described in FIG. 10 employs backward elimination techniques, and that in other embodiments, different techniques (e.g., forward selection, stepwise selection, etc.) may be employed.

Figure 11:
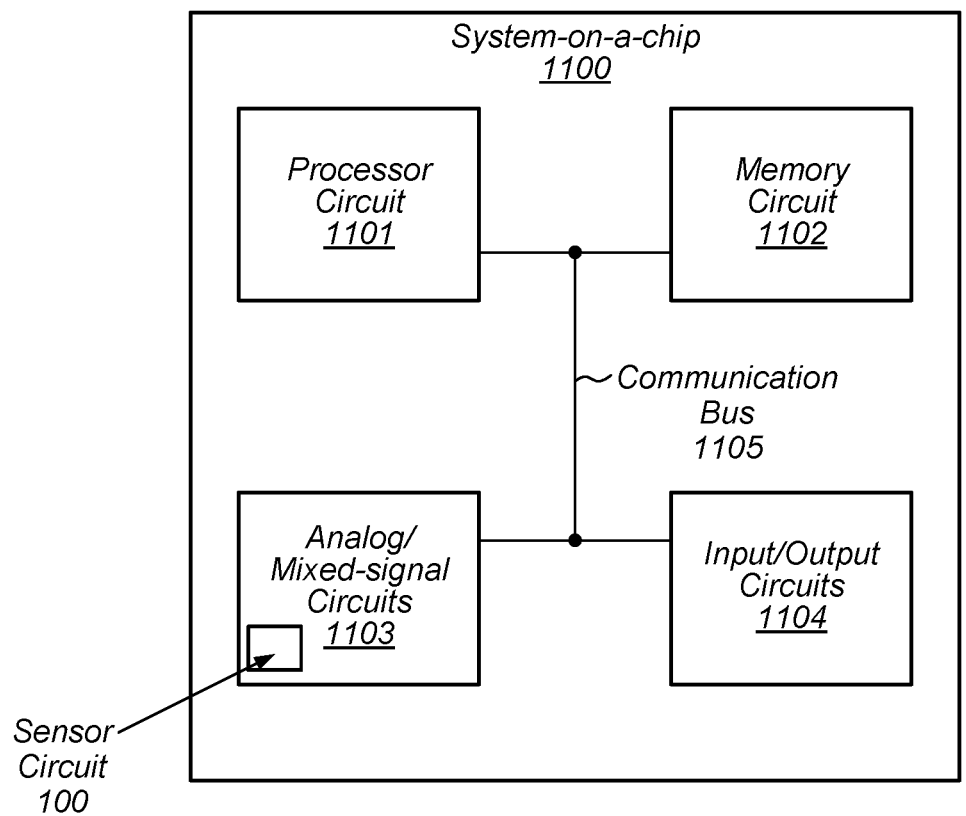
FIG. 11 is a block diagram of a system-on-a-chip.

A block diagram of a system-on-a-chip (SoC) is illustrated in FIG. 11. In the illustrated embodiment, SoC 1100 includes processor circuit 1101, memory circuit 1102, analog/mixed-signal circuits 1103, and input/output circuits 1104, each of which is coupled to communication bus 1105. In various embodiments, SoC 1100 may be configured for use in a desktop computer, server, or in a mobile computing application such as, e.g., a tablet, laptop computer, or wearable computing device.

Processor circuit 1101 may, in various embodiments, be representative of a general-purpose processor that performs computational operations. For example, processor circuit 1101 may be a central processing unit (CPU) such as a microprocessor, a microcontroller, an application-specific integrated circuit (ASIC), or a field-programmable gate array (FPGA).

Memory circuit 1102 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 11, in other embodiments, any suitable number of memory circuits may be employed.

Analog/mixed-signal circuits 1103 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 1103 may be configured to perform power management tasks with the inclusion of on-chip power supplies and voltage regulators. In some cases, analog/mixed-signal circuits 1103 may include sensor circuit 100 as depicted in FIG. 1.

Input/output circuits 1104 may be configured to coordinate data transfer between SoC 1100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1104 may be configured to implement a version of Universal Serial Bus (USB) protocol or IEEE 1394 (Firewire®) protocol.

Input/output circuits 1104 may also be configured to coordinate data transfer between SoC 1100 and one or more devices (e.g., other computing systems or integrated circuits) coupled to SoC 1100 via a network. In one embodiment, input/output circuits 1104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1104 may be configured to implement multiple discrete network interface ports.

Figure 12:
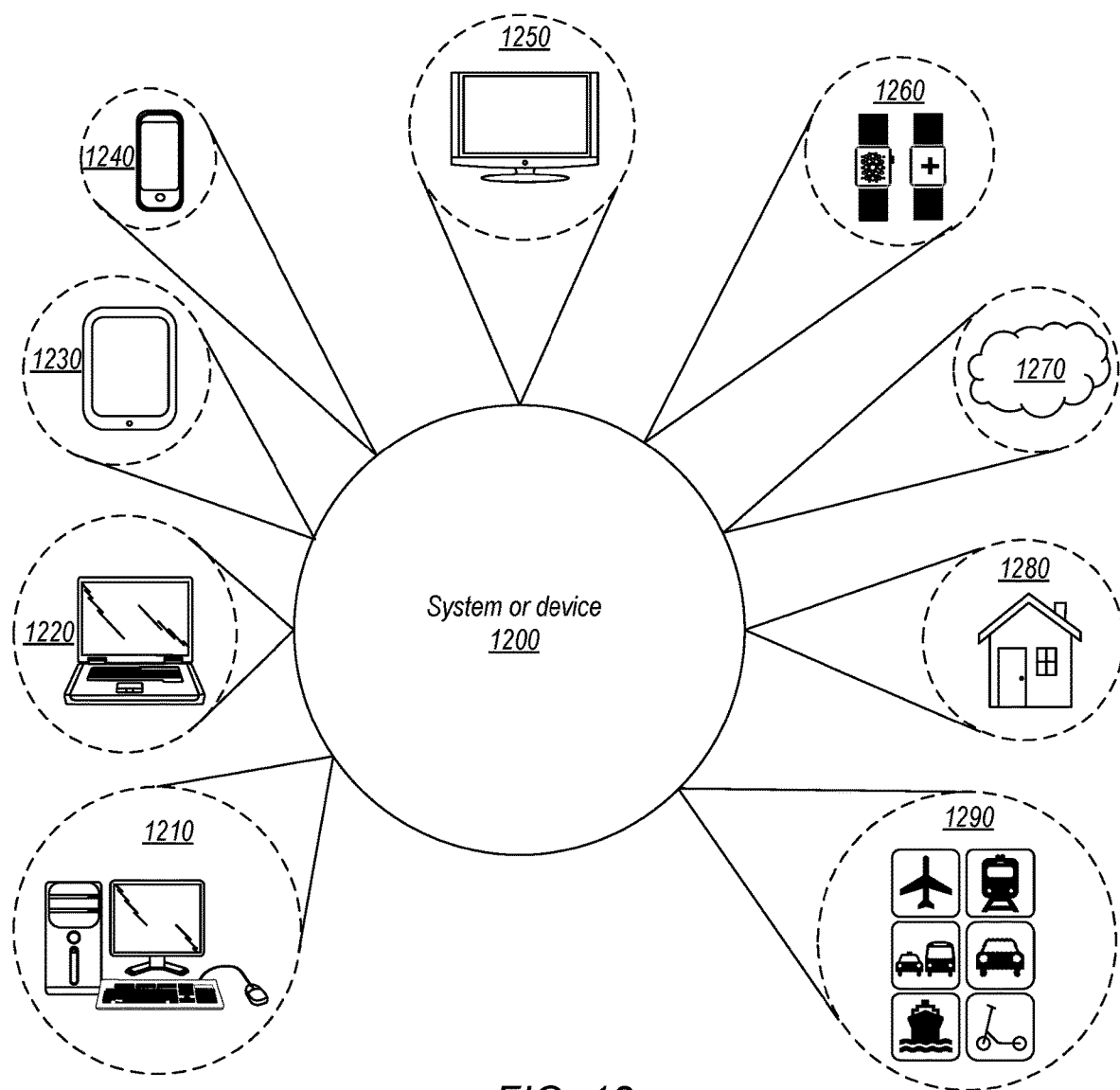
FIG. 12 is a block diagram of various embodiments of computer systems that may include sensor circuits.

Turning now to FIG. 12, various types of systems that may include any of the circuits, devices, or systems discussed above are illustrated. System or device 1200, which may incorporate or otherwise utilize one or more of the techniques described herein, may be utilized in a wide range of areas. For example, system or device 1200 may be utilized as part of the hardware of systems such as a desktop computer 1210, laptop computer 1220, tablet computer 1230, cellular or mobile phone 1240, or television 1250 (or set-top box coupled to a television).

Similarly, disclosed elements may be utilized in a wearable device 1260, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses, or a helmet designed to provide computer-generated reality experiences such as those based on augmented and/or virtual reality, etc.

System or device 1200 may also be used in various other contexts. For example, system or device 1200 may be utilized in the context of a server computer system, such as a dedicated server or on shared hardware that implements a cloud-based service 1270. Still further, system or device 1200 may be implemented in a wide range of specialized everyday devices, including devices 1280 commonly found in the home such as refrigerators, thermostats, security cameras, etc. The interconnection of such devices is often referred to as the "Internet of Things" (IoT). Elements may also be implemented in various modes of transportation. For example, system or device 1200 could be employed in the control systems, guidance systems, entertainment systems, etc. of various types of vehicles 1290.

The applications illustrated in FIG. 12 are merely exemplary and are not intended to limit the potential future applications of disclosed systems or devices. Other example applications include, without limitation: portable gaming devices, music players, data storage devices, unmanned aerial vehicles, etc.

Figure 13:
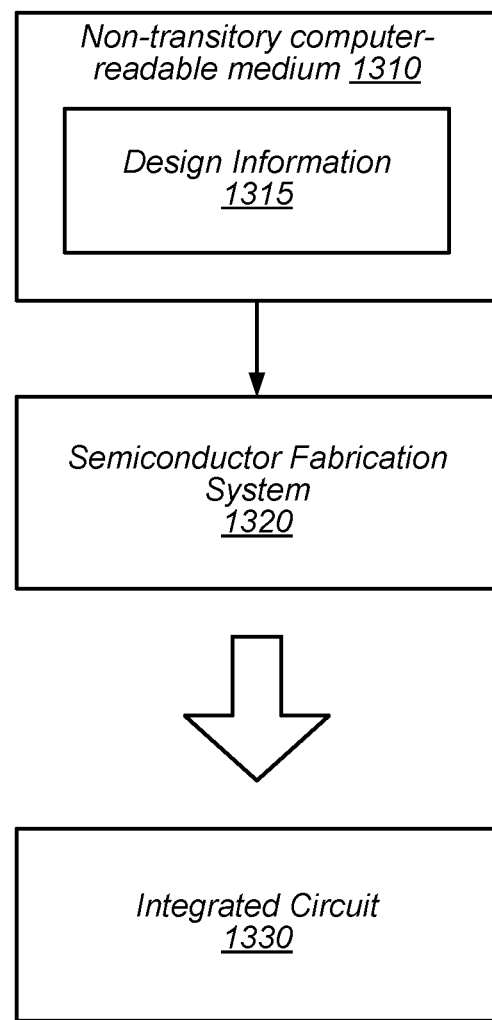
FIG. 13 illustrates an example of a non-transitory computer-readable storage medium that stores circuit design information.

FIG. 13 is a block diagram illustrating an example of a non-transitory computer-readable storage medium that stores circuit design information, according to some embodiments. In the illustrated embodiment, semiconductor fabrication system 1320 is configured to process the design information 1315 stored on non-transitory computer-readable storage medium 1310 and fabricate integrated circuit 1330 based on the design information 1315.

Non-transitory computer-readable storage medium 1310, may comprise any of various appropriate types of memory devices or storage devices. Non-transitory computer-readable storage medium 1310 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1310 may include other types of non-transitory memory as well or combinations thereof.

Non-transitory computer-readable storage medium 1310 may include two or more memory mediums, which may reside in different locations, e.g., in different computer systems that are connected over a network.

Design information 1315 may be specified using any of various appropriate computer languages, including hardware description languages such as, without limitation: VHDL, Verilog, SystemC, SystemVerilog, RHDL, M, MyHDL, etc. Design information 1315 may be usable by semiconductor fabrication system 1320 to fabricate at least a portion of integrated circuit 1330. The format of design information 1315 may be recognized by at least one semiconductor fabrication system, such as semiconductor fabrication system 1320, for example. In some embodiments, design information 1315 may include a netlist that specifies elements of a cell library, as well as their connectivity. One or more cell libraries used during logic synthesis of circuits included in integrated circuit 1330 may also be included in design information 1315. Such cell libraries may include information indicative of device or transistor level netlists, mask design data, characterization data, and the like, of cells included in the cell library.

Integrated circuit 1330 may, in various embodiments, include one or more custom macrocells, such as memories, analog or mixed-signal circuits, and the like. In such cases, design information 1315 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1320 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1320 may also be configured to perform various testing of fabricated circuits for correct operation.

In various embodiments, integrated circuit 1330 is configured to operate according to a circuit design specified by design information 1315, which may include performing any of the functionality described herein. For example, integrated circuit 1330 may include any of various elements shown or described herein. Further, integrated circuit 1330 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a plurality of sensor circuits included in an integrated circuit, wherein the plurality of sensor circuits are configured to measure corresponding ones of a plurality of physical parameters of the integrated circuit, wherein at least two of the plurality of sensor circuits are configured to measure a respective different type of physical parameter; and
   a control circuit configured to:
     receive respective information indicative of the plurality of physical parameters;
     in response to an activation of a calibration mode, generate a plurality of weights associated with a function that derives a temperature of the integrated circuit from the plurality of physical parameters; and
     in response to an activation of a mission mode, evaluate the function using the function, the plurality of weights, and at least two different types of physical parameters of the plurality of physical parameters to determine a temperature value of the integrated circuit.

2. The apparatus of claim 1, wherein the respective information indicative of the plurality of physical parameters includes a plurality of analog signals, and wherein the control circuit is further configured to:
   select a particular analog signal of the plurality of analog signals; and
   convert the particular analog signal to a plurality of bits.

3. The apparatus of claim 2, wherein the control circuit includes a memory circuit configured to store the plurality of weights associated with the function, and wherein to evaluate the function, the control circuit is further configured to retrieve the plurality of weights from the memory circuit.

4. The apparatus of claim 3, wherein to evaluate the function, the control circuit is further configured to combine a weight of the plurality of weights with a set of bits corresponding to an analog signal of the plurality of analog signals.

5. The apparatus of claim 4, wherein to combine the weight with the set of bits, the control circuit is further configured to multiply the weight and the set of bits.

6. The apparatus of claim 1, wherein the plurality of sensor circuits includes a particular sensor circuit that comprises a metal-oxide semiconductor field effect transistor and is configured to determine a threshold voltage of the metal-oxide semiconductor field effect transistor.

7. The apparatus of claim 1, wherein the at least two sensor circuits include:
   a first sensor circuit configured to measure a voltage of the integrated circuit; and
   a second sensor circuit of the at least two sensor circuits is configured to measure a base-to-collector current gain of a bipolar device included in the second sensor circuit.

8. The apparatus of claim 1, wherein the function and the plurality of weights are part of a machine learning model.

9. A method, comprising:
   receiving, by a control circuit, a plurality of signals from a corresponding plurality of sensor circuits included on an integrated circuit, wherein the plurality of signals are indicative of corresponding ones of a plurality of parameters associated with the integrated circuit, wherein at least two of the plurality of signals each correspond to a respective different type of parameter;
   retrieving, by the control circuit, a plurality of weights from a memory circuit, wherein the plurality of weights are associated with a machine learning model that correlates the plurality of weights and the plurality of parameters to a temperature in the integrated circuit;

combining, by the control circuit, a weight of the plurality of weights with data indicative of at least one of the plurality of signals to generate a weighted value of a plurality of weighted values; and combining the plurality of weighted values to generate a temperature value of the integrated circuit.

10. The method of claim 9, wherein the plurality of weights are generated using a linear regression algorithm.

11. The method of claim 9, wherein combining the weight with the data indicative of the at least one of the plurality of signals includes multiplying the weight and the data indicative of the at least one of the plurality of signals to generate the weighted value of the plurality of weighted values.

12. The method of claim 9, wherein combining the plurality of weighted values includes adding the plurality of weighted values to generate the temperature value of the integrated circuit.

13. The method of claim 9, further comprising:
gathering, from one or more integrated circuits, characterization data indicative of the plurality of parameters; and
training the model using the characterization data.

14. The method of claim 13, wherein the model incorporates the plurality of parameters, and wherein the method further comprises:
determining a least significant physical parameter of the plurality of parameters incorporated into the model;
removing the least significant physical parameter from the model;
re-training the model using remaining ones of the plurality of parameters to generate an updated model; and
determining an error associated with the updated model.

15. The method of claim 13, wherein training the model using the characterization data includes determining the plurality of weights.

16. An apparatus, comprising:
a plurality of sensor circuits included in an integrated circuit, wherein the plurality of sensor circuits are configured to generate a plurality of signals indicative of corresponding ones of a plurality of parameters associated with the integrated circuit, wherein at least two of the plurality of signals each correspond to a respective different type of parameter; and
a memory circuit configured to store a plurality of weights associated with a model that defines a function that correlates the plurality of weights and ones of the plurality of parameters to a temperature in the integrated circuit; and
a control circuit configured to:
receive the plurality of signals;
retrieve the plurality of weights from the memory circuit;
combine, based on the model, a weight of the plurality of weights with data indicative of at least one of the plurality of signals to generate a weighted value of a plurality of weighted values; and
combine, based on the model, the plurality of weighted values to generate a temperature value of the integrated circuit.

17. The apparatus of claim 16, wherein the control circuit is further configured to, during a calibration mode:
receive characterization data; and
retrain the model using the characterization data.

18. The apparatus of claim 17, wherein to retrain the model using the characterization data, the control circuit is further configured to determine new values for one or more of the plurality of weights.

19. The apparatus of claim 16, wherein to combine the weighted value with the data indicative of the at least one of the plurality of signals, the control circuit is further configured to multiply the weight and the data indicative of the at least one of the plurality of signals to generate the weighted value of the plurality of weighted values.

* * * * *